United States Patent [19]
DeWolf et al.

[11] Patent Number: 5,995,912
[45] Date of Patent: Nov. 30, 1999

[54] DATABASE AND METHOD FOR MEASUREMENT CORRECTION FOR CROSS-SECTIONAL CARRIER PROFILING TECHNIQUES

[75] Inventors: Peter DeWolf, Eeklo; Trudo Clarysse, Antwerpen; Wilfried Vandervorst, Mechelen, all of Belgium

[73] Assignee: IMEC vzw, Belgium

[21] Appl. No.: 08/840,390

[22] Filed: Apr. 29, 1997

Related U.S. Application Data

[60] Provisional application No. 60/016,497, Apr. 30, 1996.

[51] Int. Cl.$^6$ .............................. G01R 27/02; G01R 27/08
[52] U.S. Cl. ................... 702/85; 364/468.28; 395/500.2; 324/719
[58] Field of Search ................................. 702/85, 22, 23; 324/715, 719, 724; 29/592; 395/500.2, 500.21, 500.22, 500.23; 364/468.24–468.28

[56] References Cited

U.S. PATENT DOCUMENTS 5,347,226  9/1994  Bachmann et al. ...................... 324/724
5,585,734  12/1996  Meuris et al. ........................... 324/719

OTHER PUBLICATIONS

"One–and two–dimensional carrier profiling in semiconductors by nanospreading resistance profiling", P. DeWolf et al., J. Vac. Sci. Technol. B 14(1), Jan./Feb. 1996.
"Lateral and vertical dopant profiling in semiconductors by atomic force microscopy using conducting tips", P. DeWolf et al., J. Vac. Sci. Technol. A 13(3), May/Jun. 1995.
"Quantitative two–dimensional dopant profile measurement and inverse modeling by scanning capacitance microscopy", Y. Huang et al., Appl. Phys. Lett. 66(3), Jan. 16, 1995.
"Two–dimensional scanning capacitance microscopy measurements of cross–sectioned very large scale integration test structure", Gabi Neubauer et al., J. Vac. Sci, Technol. B 14(1), Jan./Feb. 1996.
"Scanning capacitance microscopy measurements and modeling: Progress towards dopant profiling of silicon", J. Vac. Sci. Technol. B 14(1), Jan./Feb. 1996.
"Critical Metrology and Analytical Technology Based on the Process and Materials Requirements of the 1994 National Technology Roadmap for Semiconductors", Alain C. Diebold, pp. 25–41, 1996 American Institute of Physics.
"Physics of Semiconductor Devices, Second Edition", S.M. Sze, John Wiley & Sons No Date.
"Dessis$_{ISE}$ Reference Manual", Version 1.3, ISE Integrated Systems Engineering AG (1994).
"Generic Multi–disciplinary Optimal Design Synthesis", LMS Numerical Technologies No Date.
"An Efficient Smoothing Algorithm For Spreading Resistance Calculations", T. Clarysse et al., Solid State Electronics vol. 31, No. 1, pp. 53–63 (1988).

*Primary Examiner*—Kamini Shah
*Attorney, Agent, or Firm*—Ostrolenk, Faber, Gerb & Soffen, LLP

[57] ABSTRACT

A database method and method of using the database for determining the carrier concentration profile of a semiconductor, wherein the database includes a first set of first data, the first data being a correction factor; and a second set of second data, each of the second data including first and a second set of parameters, the first set of parameters characterizing the carrier concentration profile and the second set of parameters characterizing the measurement technique. Each data of the first set of first data is obtained from one data of the second set of data through simulation or calculation.

16 Claims, 9 Drawing Sheets

| curv. | slope | bound | CF |
|---|---|---|---|
| 0.0 | -0.4 | 0.0 | 0.67380 |
| 0.0 | -0.4 | 0.5 | 0.59775 |
| 0.0 | -0.4 | 1.0 | 0.56960 |
| 0.0 | -0.4 | 2.0 | 0.56320 |
| 0.0 | -0.4 | 4.0 | 0.56 |
| 0.0 | -0.4 | 8.0 | 0.56 |
| 0.0 | -0.4 | 16.0 | 0.56 |
| 0.0 | -0.1 | 0.0 | 1.5556 |
| 0.0 | -0.1 | 0.5 | 1.2738 |
| 0.0 | -0.1 | 1.0 | 1.13316 |
| 0.0 | -0.1 | 2.0 | 1.04162 |
| 0.0 | -0.1 | 4.0 | 1.03147 |
| 0.0 | -0.1 | 8.0 | 1.03 |
| 0.0 | -0.1 | 16.0 | 1.03 |
| 0.0 | 0.0 | 0.0 | 2.0 |
| 0.0 | 0.0 | 0.5 | 1.579 |
| 0.0 | 0.0 | 1.0 | 1.360 |
| 0.0 | 0.0 | 2.0 | 1.171 |
| 0.0 | 0.0 | 4.0 | 1.087 |
| 0.0 | 0.0 | 8.0 | 1.000 |
| 0.0 | 0.0 | 16.0 | 1.000 |
| 0.0 | 0.1 | 0.0 | 3.5501 |
| 0.0 | 0.1 | 0.5 | 2.64536 |
| 0.0 | 0.1 | 1.0 | 2.11898 |
| 0.0 | 0.1 | 2.0 | 1.60418 |
| 0.0 | 0.1 | 4.0 | 1.24397 |
| 0.0 | 0.1 | 8.0 | 1.07326 |
| 0.0 | 0.1 | 16.0 | 1.07326 |
| 0.0 | 0.4 | 0.0 | 6.95504 |
| 0.0 | 0.4 | 0.5 | 4.05328 |
| 0.0 | 0.4 | 1.0 | 2.51189 |
| 0.0 | 0.4 | 2.0 | 1.17793 |
| 0.0 | 0.4 | 4.0 | 0.63895 |
| 0.0 | 0.4 | 8.0 | 0.567714 |
| 0.0 | 0.4 | 16.0 | 0.567714 |

| | | | |
|---|---|---|---|
| 0.02 | -0.4 | 0.0 | 0.67380 |
| 0.02 | -0.4 | 0.5 | 0.59775 |
| 0.02 | -0.4 | 1.0 | 0.56960 |
| 0.02 | -0.4 | 2.0 | 0.56320 |
| 0.02 | -0.4 | 4.0 | 0.56 |
| 0.02 | -0.4 | 8.0 | 0.56 |
| 0.02 | -0.4 | 16.0 | 0.56 |
| 0.02 | -0.1 | 0.0 | 1.5556 |
| 0.02 | -0.1 | 0.5 | 1.2738 |
| 0.02 | -0.1 | 1.0 | 1.13316 |
| 0.02 | -0.1 | 2.0 | 1.04162 |
| 0.02 | -0.1 | 4.0 | 1.03147 |
| 0.02 | -0.1 | 8.0 | 1.03 |
| 0.02 | -0.1 | 16.0 | 1.03 |
| 0.02 | 0.0 | 0.0 | 2.38538 |
| 0.02 | 0.0 | 0.5 | 1.88335 |
| 0.02 | 0.0 | 1.0 | 1.60928 |
| 0.02 | 0.0 | 2.0 | 1.37691 |
| 0.02 | 0.0 | 4.0 | 1.24915 |
| 0.02 | 0.0 | 8.0 | 1.19715 |
| 0.02 | 0.0 | 16.0 | 1.19715 |
| 0.02 | 0.1 | 0.0 | 3.5501 |
| 0.02 | 0.1 | 0.5 | 2.64536 |
| 0.02 | 0.1 | 1.0 | 2.11898 |
| 0.02 | 0.1 | 2.0 | 1.60418 |
| 0.02 | 0.1 | 4.0 | 1.24397 |

FIG. 4 (b)

| curv. | slope | bound | CF |
|---|---|---|---|
| 0.02 | 0.1 | 8.0 | 1.07326 |
| 0.02 | 0.1 | 16.0 | 1.07326 |
| | | | |
| 0.02 | 0.4 | 0.0 | 6.95504 |
| 0.02 | 0.4 | 0.5 | 4.05328 |
| 0.02 | 0.4 | 1.0 | 2.51189 |
| 0.02 | 0.4 | 2.0 | 1.17793 |
| 0.02 | 0.4 | 4.0 | 0.63895 |
| 0.02 | 0.4 | 8.0 | 0.567714 |
| 0.02 | 0.4 | 16.0 | 0.567714 |
| | | | |
| 0.06 | -0.4 | 0.0 | 0.795577 |
| 0.06 | -0.4 | 0.5 | 0.703513 |
| 0.06 | -0.4 | 1.0 | 0.669058 |
| 0.06 | -0.4 | 2.0 | 0.659488 |
| 0.06 | -0.4 | 4.0 | 0.65 |
| 0.06 | -0.4 | 8.0 | 0.65 |
| 0.06 | -0.4 | 16.0 | 0.65 |
| | | | |
| 0.06 | -0.1 | 0.0 | 2.02896 |
| 0.06 | -0.1 | 0.5 | 1.66988 |
| 0.06 | -0.1 | 1.0 | 1.48521 |
| 0.06 | -0.1 | 2.0 | 1.3464 |
| 0.06 | -0.1 | 4.0 | 1.28356 |
| 0.06 | -0.1 | 8.0 | 1.27821 |
| 0.06 | -0.1 | 16.0 | 1.27821 |
| | | | |
| 0.06 | 0.0 | 0.0 | 2.7509 |
| 0.06 | 0.0 | 0.5 | 2.16842 |
| 0.06 | 0.0 | 1.0 | 1.84596 |
| 0.06 | 0.0 | 2.0 | 1.56698 |
| 0.06 | 0.0 | 4.0 | 1.41446 |
| 0.06 | 0.0 | 8.0 | 1.37725 |
| 0.06 | 0.0 | 16.0 | 1.37725 |
| | | | |
| 0.06 | 0.1 | 0.0 | 3.61264 |
| 0.06 | 0.1 | 0.5 | 2.68381 |
| 0.06 | 0.1 | 1.0 | 2.15156 |
| 0.06 | 0.1 | 2.0 | 1.66301 |
| 0.06 | 0.1 | 4.0 | 1.37396 |
| 0.06 | 0.1 | 8.0 | 1.27616 |
| 0.06 | 0.1 | 16.0 | 1.27616 |
| | | | |
| 0.06 | 0.4 | 0.0 | 6.99553 |
| 0.06 | 0.4 | 0.5 | 4.00601 |
| 0.06 | 0.4 | 1.0 | 2.48621 |
| 0.06 | 0.4 | 2.0 | 1.26761 |
| 0.06 | 0.4 | 4.0 | 0.774033 |
| 0.06 | 0.4 | 8.0 | 0.676012 |
| 0.06 | 0.4 | 16.0 | 0.676012 |
| | | | |
| 0.10 | -0.7 | 0.0 | 0.452245 |
| 0.10 | -0.7 | 0.5 | 0.42008 |
| 0.10 | -0.7 | 1.0 | 0.411167 |
| 0.10 | -0.7 | 2.0 | 0.409942 |
| 0.10 | -0.7 | 4.0 | 0.4 |
| 0.10 | -0.7 | 8.0 | 0.4 |
| 0.10 | -0.7 | 16.0 | 0.4 |
| | | | |
| 0.10 | -0.4 | 0.0 | 0.953441 |
| 0.10 | -0.4 | 0.5 | 0.842408 |
| 0.10 | -0.4 | 1.0 | 0.799282 |
| 0.10 | -0.4 | 2.0 | 0.779772 |
| 0.10 | -0.4 | 4.0 | 0.77 |
| 0.10 | -0.4 | 8.0 | 0.77 |
| 0.10 | -0.4 | 16.0 | 0.77 |

DATABASE AND METHOD FOR MEASUREMENT CORRECTION FOR CROSS-SECTIONAL CARRIER PROFILING TECHNIQUES

The present patent application claims priority from U.S. Provisional application Ser. No. 60/016,497, filed Apr. 30, 1996. The disclosure of U.S. Pat. No. 5,369,372 and U.S. Pat. No. 5,585,734, and U.S. patent application Ser. No. 08/673,616 filed Jun. 16, 1996, now U.S. Pat. No. 5,723,981 are incorporated herein by reference.

FIELD OF THE INVENTION

The present invention relates to the field of electrical measurements on a semiconductor. More in particular the present invention relates to a method and database to recover from the electrical measured data of cross-sectional carrier profiling techniques on said semiconductor the exact carrier or dopant profiles of the semiconductor.

BACKGROUND OF THE INVENTION

Recently, several microscopic techniques were developed for determining the carrier distribution in semiconductor structures. In each of these techniques, an ultrafine probe is used to measure an (electrical) variable which is related to the carrier concentration at the position of the probe. For example, in the nanospreading resistance profiling method (nano-SRP) as described in references "P. De Wolf, T. Clarysse, W. Vandervorst, J. Snauwaert, and L. Hellemans, J. Vac. Sci. Technol. B 14, 380 (1996).", "P. De Wolf, J. Snauwaert, L. Hellemans, T. Clarysse, W. Vandervorst, M. D'Olieslaeger, and D. Quaehaegens, J. Vac. Sci. Technol. A 13, 1699 (1995).", "U.S. Pat. Nos. 5,369,372 & 5,585,734." the resistance R is measured between a conductive atomic force microscope (AFM) probe and a large contact connected to the back of the semiconductor while the probe is stepped across the semiconductor cross section. The measured resistance is dominated by the spreading resistance at the probe-semiconductor contact, which is a measure for the local carrier concentration. Another example, the scanning capacitance microscopy (SCM) as described in "Y. Huang, C. C. Williams, and J. J. Slinkman, Appl. Phys. Lett. 66, 344–346 (1995).", "G. Neubauer, A. Erickson, C. C. Williams, J. J. Kopanski, M. Rodgers, and D. Adderton, J. Vac. Sci. Technol. B14, 426 (1996).", "J. J. Kopanski, J. F. Marchiando, and J. R. Lowney, J. Vac. Sci. Technol. B14, 242 (1996)." monitors the capacitance C between an AFM probe and a semiconductor surface or its derivative $\partial C/\partial V$ while the probe is moved across the semiconductor cross section. The measured capacitance or capacitive gradient as a function of bias voltage provides a direct measurement of the local activated dopant density. By using AFM technology, each of these techniques obtains a high spatial resolution comparable to the average radius of the probe-semiconductor contact. Yet, besides a high resolution (currently around 20 nm), also a high accuracy of the dopant concentration is required by current and future silicon technologies: typically 10% for a 0.25 $\mu$m integrated circuit (IC) technology and 5% for a 0.18 $\mu$m IC technology as described in "L. Larson, and M. Duane, NIST Workshop on Industrial Applications of Scanning Probe Microscopy, Gaithersburg MD, Mar 24–25 (1994).". This accuracy can only be obtained when the electrical measurements (either resistance, capacitance or any other quantity) are reproducible, noise-free and when the relation between the measured data and the underlying carrier profile is exactly known. For semi-infinite uniformly doped semiconductor samples this relation is known from theory or from a set of calibration measurements. For example, in nano-SRP the spreading resistance R of a non-penetrating, circular (radius $\alpha$), Ohmic probe contact on a uniformly doped semiconductor (resistivity r) is given by equation (eq1).:

$$R = \frac{\rho}{4 \cdot a} \quad \text{(eq1)}$$

The relation between the resisitivity and the carrier concentration is given by a coupled set of differential equations consisting of the mobility and Poisson equations "Sze, Semiconductor Physics, J. Wiley & Sons, New York, 1981.". For contacts which are not ideal, equation (1) is replaced by a set of calibration curves which plot the resistance measured on homogeneously doped semiconductors as a function of their resistivity as described in "P. De Wolf, J. Snauwaert, L. Hellemans, T. Clarysse, W. Vandervorst, M. D'Olieslaeger, and D. Quaehaegens, J. Vac. Sci. Technol. A 13, 1699 (1995).". In this way, one n-type and one p-type curve is constructed. For non-homogeneously doped semiconductors there is a problem in the art. Since all techniques measure on the cross section of a semiconductor, other regions of the profile (containing different carrier concentrations) are very near and the electrical measurement can be dominated by the highly (or poorly) doped parts of the carrier profile. Thus, the electrical value measured at a position x is no longer exclusively determined by the carrier concentration at x, but by the entire surrounding carrier profile. As a consequence, the theoretical relation and the calibration curves can no longer be used directly to transform the measured profile into the correct carrier concentration profile.

SUMMARY OF THE INVENTION

The correct evaluation of the impact of aforementioned problem requires a detailed calculation, ultimately leading to a deconvolution algorithm which transforms the measured profile into the correct carrier profile.

Thereto in a first aspect of the invention, a method is disclosed to recover from the electrical measured data of cross-sectional carrier profiling techniques, the exact carrier or dopant profiles of the semiconductor structure under investigation. A general scheme for transforming a wide range of profiles is disclosed. Using this method, quantitative carrier profile data can be obtained with high accuracy, without any loss in spatial resolution. In a second aspect of the present invention, a database, compiled on a computer environment, and adapted for deriving a carrier concentration profile in a non-homogeneously doped semiconductor from a cross-sectional profiling measurement technique is disclosed. The database comprises a first set of first data, said first data being a correction factor; a second set of second data, essentially each of said second data comprising a first and a second set of parameters, said first set of parameters characterizing said carrier concentration profile, said second set of parameters characterizing said measurement technique; and essentially each data of said first set of first data being obtained from one data of said second set of data through simulation or calculation. The correction factor can be adapted for correcting a theoretical or calibrated relationship between the carrier concentration in said non-homogeneously doped semiconductor and measurement data of said measurement technique on said non-homogeneously doped semiconductor, said relationship being defined for a semiconductor with a homogeneous carrier distribution. The database allows to implement the method of the invention.

BRIEF DESCRIPTION OF THE DRAWINGS

Other features and advantages of the present invention will become apparent from the following description of the invention which refers to the accompanying drawings.

FIGS. 3(a), 3(b) and 3(c) show extract of the correction factor database for nano-SRP showing the evolution of the correction factor as a function of the probe radius, slope, curvature, and distance to an isolating boundary. A graphical presentation is given for three different distances: FIG. 3(a); and 10, FIG. 3(b) 1 and FIG. 3(c) 0 probe radii (i.e. the probe is positioned exactly on top of the boundary). Each time, 4 curves which show the correction factor versus the relative slope of the profile (given in decades) are given for 4 different relative slopes (given in decades): (A) 0.02, (B) 0.1, (C) 0.5 and (D) 1.0.

DETAILED DESCRIPTION OF THE INVENTION

The present patent application discloses a method and a database for deriving a carrier concentration profile in a non-homogeneously doped semiconductor from a cross-sectional profiling measurement technique. Examples are given which illustrate the accuracy of the method for two cross-sectional carrier profiling techniques: nanospreading resistance profiling and scanning capacitance microscopy. The procedure for recovering a carrier (or dopant) profile from a measured profile, that is used in the method of the invention and according to which the database is constructed, is split into two parts. In the first part, the profile is calculated which pertains to a known carrier profile (the 'forward' problem). In the second part, the 'inverse' problem of recovering the carrier profile from a set of measured values is solved. The nano-SRP technique is used as an example to describe both problems (forward and inverse) in detail. The method of the invention can also be used for other carrier profiling techniques such as SCM. The changes which must be made to the procedure needed for the SCM technique are given as an example.

Nano-SRP deconvolution

Current-spreading simulations for simple one-dimensional examples: Problem definition First, we take a look at the importance of the current spreading for some simple one-dimensional carrier profile examples, assuming that the Laplace equation for the potential distribution in the semiconductor (replacing the Poisson equation) is valid. Charge accumulation or depletion at boundaries and carrier spilling effects must therefore be assumed to be a second order effect. Since the current spreading underneath the probe has a three-dimensional (3D) nature, analytical solution of the Laplace equation with the appropriate boundary conditions becomes very complex, if not impossible. An easy way to study the nano-SRP current distribution is by using 3D finite element simulation packages. In this work the finite element simulator DESSIS "DESSIS device simulator, ISE (Integrated Systems Engineering AG, Technopark Zürich, Technoparkstrasse 1, CH-8005 Zürich, Switserland)." was used in combination with the simulation experiment sequencing system NORMAN/DEBORA ["NORMAN/DEBORA, software package developed and commercialized by IMEC and NIT, Belgium."]. A mesh is designed so that the meshing is very fine near the probe-semiconductor contact, but at the same time sufficiently large so that it approximates a semiinfinite solid. No significant change in result was observed when the mesh was further refined. Furthermore, the results obtained in test runs were unchanged when the outer nodes were assumed isolating or metallic. For these reasons it is believed that the mesh provides a very good approximation for an infinite semiconductor substrate.

Figure 1A:
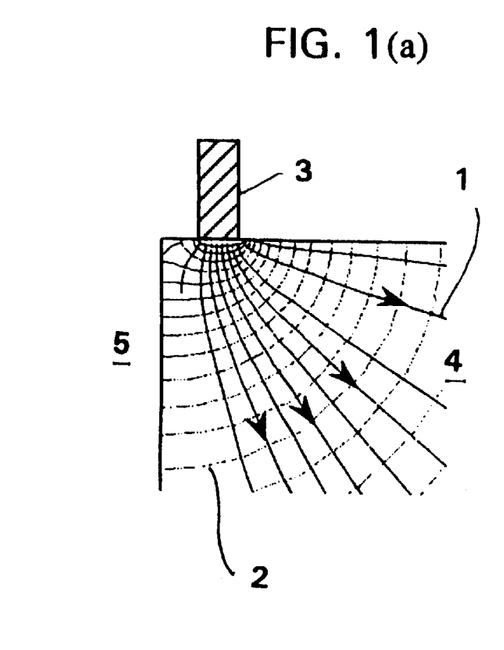
FIGS. 1(a), 1(b) and 1(c) show current Current distribution (1) and potential contour lines (2) under a nano-SRP probe (3) on a homogeneously doped semiconductor structure (4) with FIG. 1(a) showing a nearby isolating boundary (5), FIG. 1(b) showing a semiinfinite, uniform layer, and FIG. 1(c) a nearby perfectly conducting boundary (6).
Figure 1B:
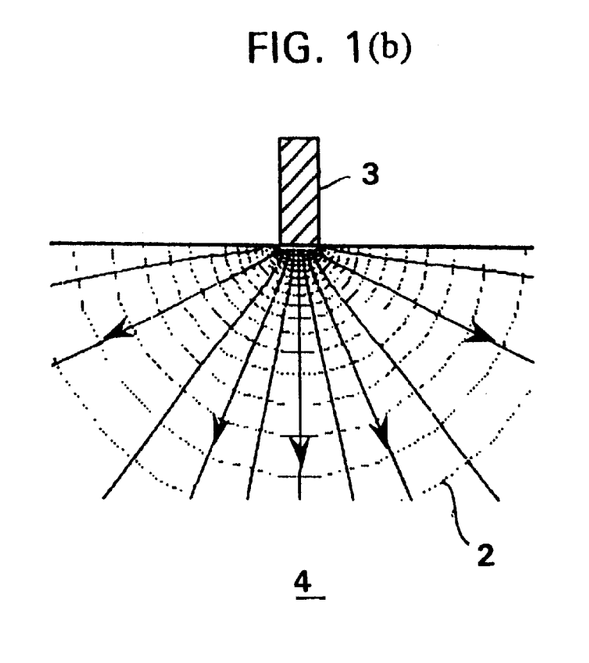
Figure 1C:
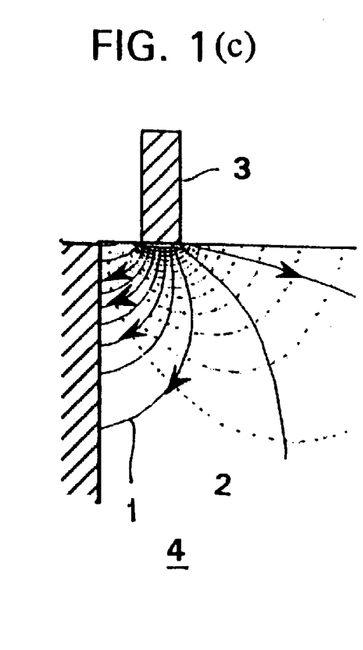

FIGS. 1(a), 1(b) and 1(c) show the electrostatic potential contour plots (2) and the current flow lines (1) obtained by using the DESSIS simulator for a homogeneously doped semiconductor (4) in three different situations: FIG. 1(a) isolating boundary (5), FIG. 1(b) semiinfinite uniformly doped material and FIG. 1(c) perfectly conducting boundary (6). By studying these simple, but extreme situations in more detail we can form an idea about the impact of the corrections needed for nano-SRP measurements. First, a correction factor a is defined by replacing the theoretical relation (eq1) by equation (eq2).

$$R = \alpha \cdot \frac{\rho}{4 \cdot a} \qquad (eq2)$$

Figure 2:
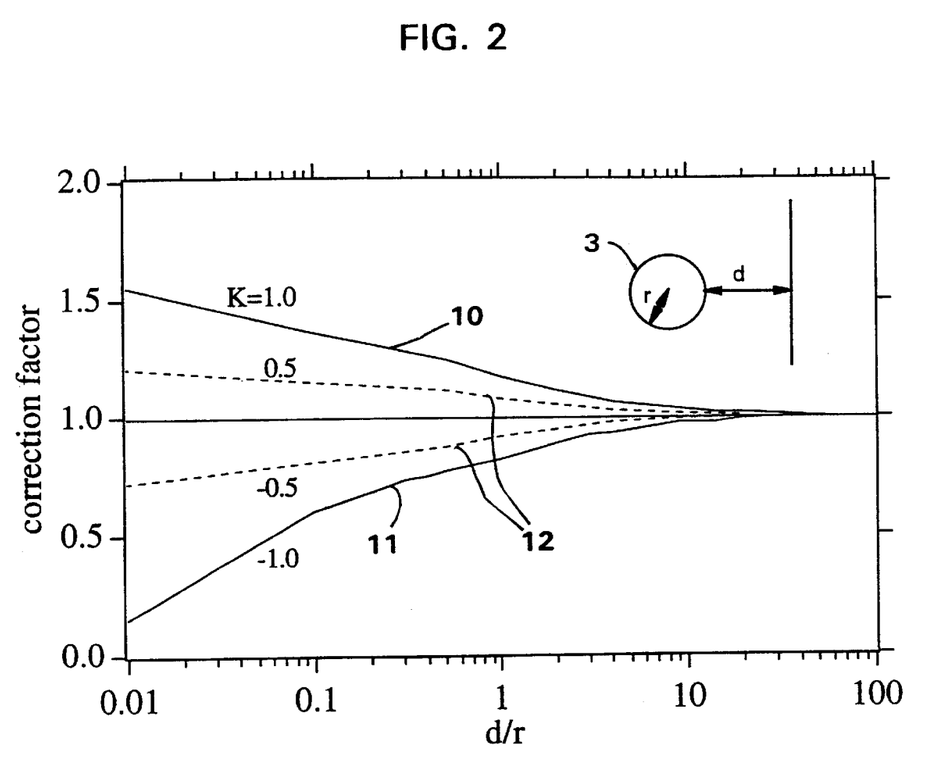
FIG. 2 shows a nanon-SRP current spreading correction factors for a homogeneously doped semiconductor with a perfectly conducting (top curve, 10) and perfectly isolating (bottom curve, 11) boundary. The dashed lines (12) show the correction factor for some resisivity ratios κ.

The correction factor a corrects the measured resistance data for the current spreading effect and equals 1 for a uniformly doped semiinfinite substrate (FIG. 1b). When the semiconductor structure has an isolating boundary, a increases if the probe is moved towards the boundary, and reaches 2 for the limiting case when the boundary is positioned exactly under the probe-centre (FIG. 1a). If the isolating boundary is replaced by a perfectly conducting one, the correction factor a becomes smaller than 1 and decreases toward 0 when the probe touches the conducting boundary (FIG. 1c). FIG. 2 shows the relation (10 and 11) between the correction factor and the distance to the isolating (5) or conducting (6) boundary. Also given is the evolution (12) of the correction factor as a function of the distance for nearby layers with well known resistivity ratio K which is defined as $$K = \frac{\rho_2 - \rho_1}{\rho_2 + \rho_1} \quad (eq3)$$

where $r_1$ and $r_2$ respectively represent the resistivity of the substrate (i.e. under the probe) and the nearby layer. The effect of the contact size was taken into account by scaling the distance with the contact radius. Several conclusions can be drawn from this figure. First of all, the correction factor α is limited to values between 0.1 and 2 for reasonable distances (d/r>0.01). Secondly, although the appearance of a boundary (in particular a conductive one) near the probe has a strong influence on the value of the correction factor, its effect is seen to die out quickly when the probe is moved away from the boundary. Third, decreasing the size of the contact radius will decrease the sampling volume, and thus reduce the effect of nearby layers.

The correction factors described so far, cannot be used to transform a measured resistance profile into a quantitatively correct dopant or carrier profile. They only give an idea of the influence of differently doped nearby layers on the current spreading under the probe-semiconductor contact. In the next section a method is presented to correct a measured resistance profile for current spreading effects. First, the 'forward' problem (carrier profile→resistance profile) is solved, and then the more complicated 'inverse' problem (resistance profile→carrier profile) is solved.

Forward Problem

The purpose of the forward method is to compute the resistance profile which will be measured on a particular (known) carrier profile. The forward method is composed of five steps, each of them explained in detail in what follows.

(f1) define a correction factor
(f2) find a set of parameters describing the resistivity profile adequately
(f3) construct a database of correction factors as a function of the parameters
(f4) calculate the parameters for a given resistivity profile and use interpolation of the database to find the correction factor profile which pertains to a given resistivity profile.
(f5) use the definition of the correction factor and the computed correction factor profile to calculate the resistance profile.

In a first step, a correction factor α is defined which corrects the measured data for the current spreading effect. The correction factor is defined by its introduction in the basic nano-SRP equation (eq2) which gives the relation between the resistance and the resistivity. If one starts from a dopant or carrier concentration profile, one can always reduce the problem to a resistivity-resistance conversion by using the Poisson, transport and mobility equations to transform the dopant or carrier profile into the corresponding resistivity profile. Second, parameters are searched which describe the resistivity profile adequately. In this context, it is important to determine which parameters have a notable influence on the correction factors and at the same time describe as much as possible of the resistivity profile. Parameters which have little or no influence on the spreading effect are avoided. The most significant characteristics are (i) the general shape of the resistivity profile
(ii) the distance to insulating or conducting boundaries
(iii) the probe radius A straightforward choice for the parameters, describing the shape of the resistivity profile r(x,y) in a particular point $\{x_0, y_0\}$, are the first N coefficients in the Taylor series expansion, for one and two-dimensional profiles respectively given by $$\left(\frac{1}{n!} \cdot \frac{\partial^n f(x)}{\partial x^n}\right)\bigg|_{x_0} \quad (n = 1, 2, \ldots) \quad (eq4)$$

and $$\left(\frac{1}{m! \cdot n!} \cdot \frac{\partial^{m+n} f(x, y)}{\partial x^m \partial y^n}\right)\bigg|_{x_0, y_0} \quad (m, n = 1, 2, \ldots) \quad (eq5)$$

where $f(x,y)=\log(\rho(x,y))$ (one normally uses the logarithmic values instead of the data themselves). From the simple examples, illustrated in FIGS. 1 and 2, we already know that the sampling volume (i.e. the volume around the probe-semiconductor contact influencing the current spreading) is small. Hence, the shape of the profile needs to be parametrized precisely only locally (i.e. within this volume). All physical resistivity profiles can locally be matched as good as desired by taking more Taylor terms into account. For a wide range of real-life resistivity profiles only the first and second order terms are significant and the contribution from higher order terms can be neglected. For one-dimensional profiles, the first two terms correspond to the local slope (number of decades of resistivity change per $\mu$m or decades/$\mu$m) and curvature (decades/$\mu m^2$). Whenever higher accuracy is necessary, higher order terms can be taken into account. For two-dimensional profiles, five parameters (slope and curvature in x and y direction and mixed curvature) are needed and higher order terms (i.e. >2) can again be neglected. Besides the shape of the resistivity profile, also the appearance of insulating or conducting boundaries, which are a part of the semiconductor structure under investigation, like oxide or metalization layers has to be taken into account. Clearly, the distance to such boundaries is not included in the Taylor terms (eq4) or (eq5), but can produce extra current spreading as was already shown in FIGS. 1 and 2.

Figure 3A:
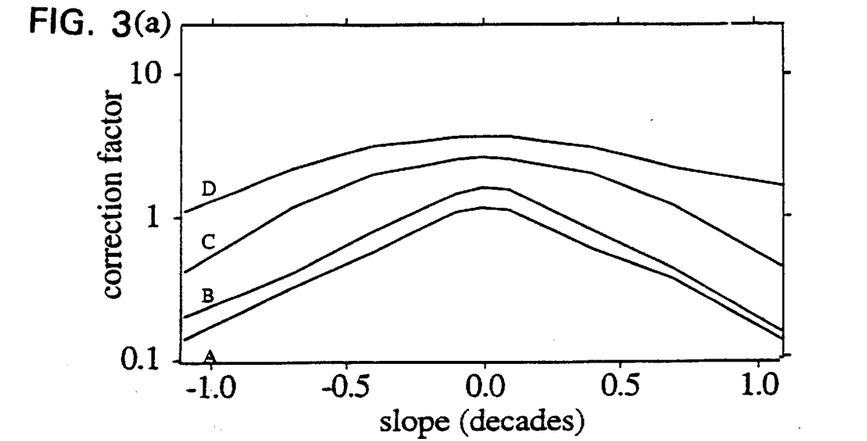
Figure 3B:
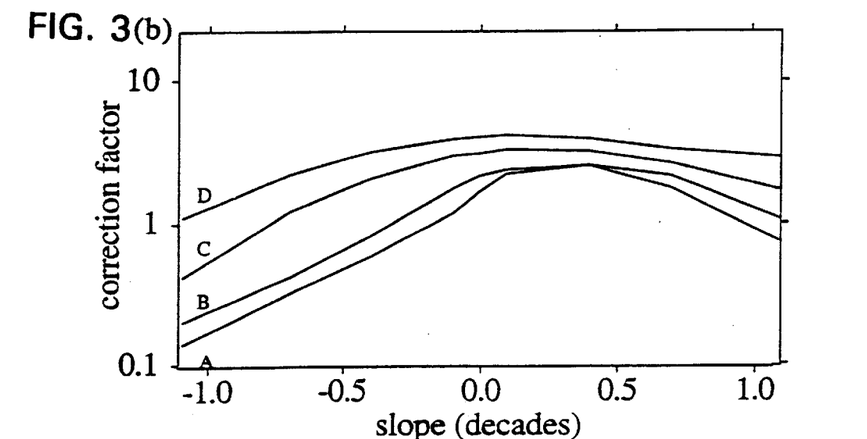
Figure 3C:
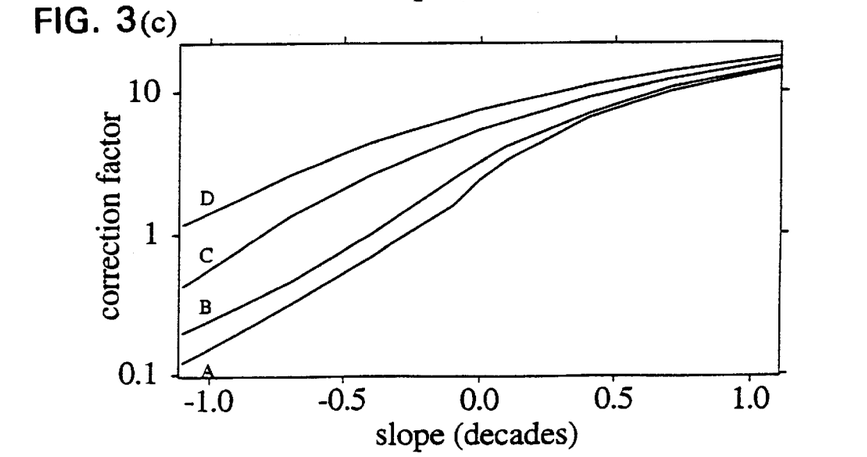
Figure 4:
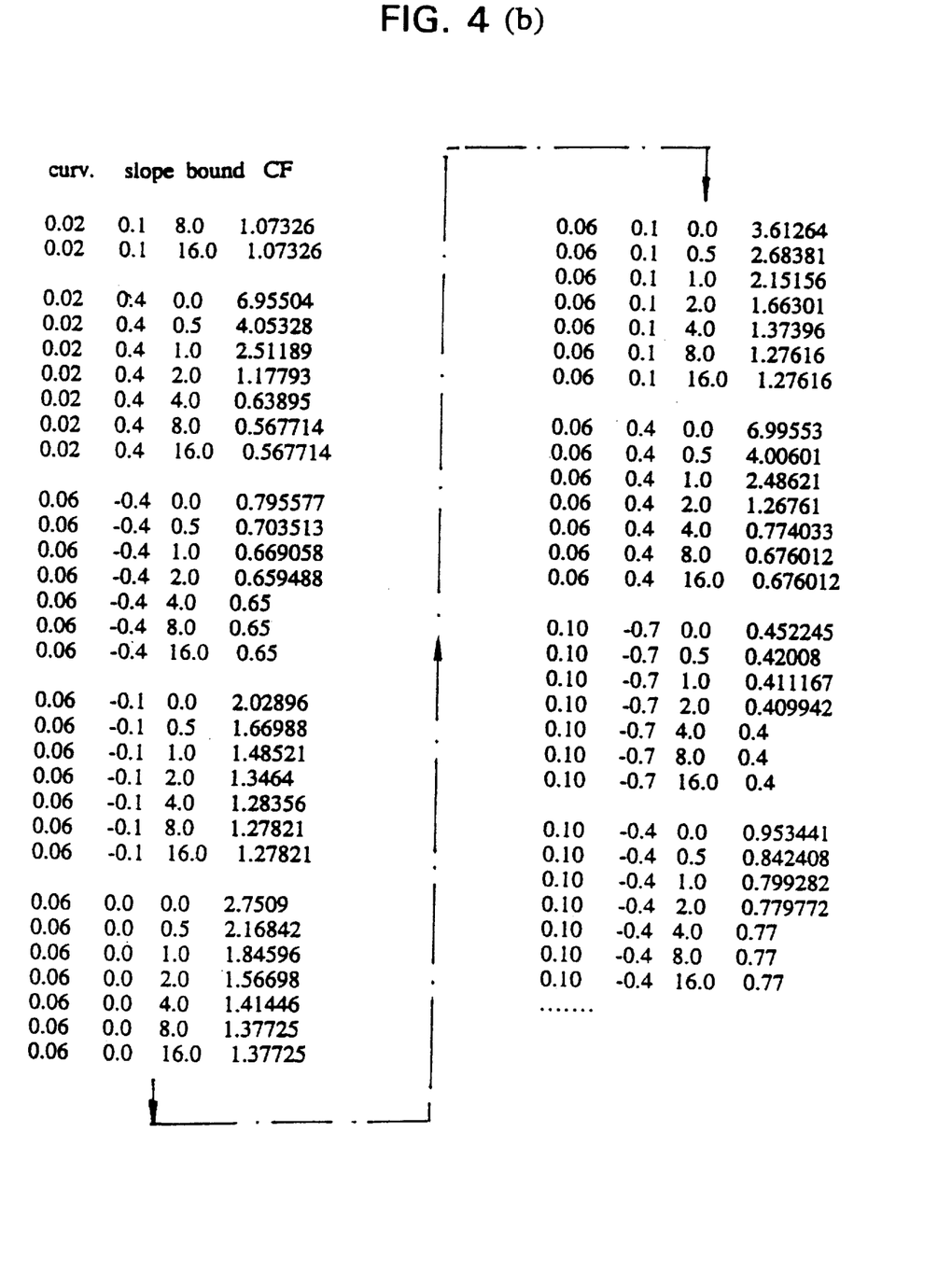
FIGS. 4(a) and 4(b) show extract of the correction factor database for nano-SRP in a table displaying the evolution of the correction factor as a function of the probe radius, slope, curvature, and distance to an isolating boundary. Only a small fraction of the complete database is displayed.
Figure 4A:
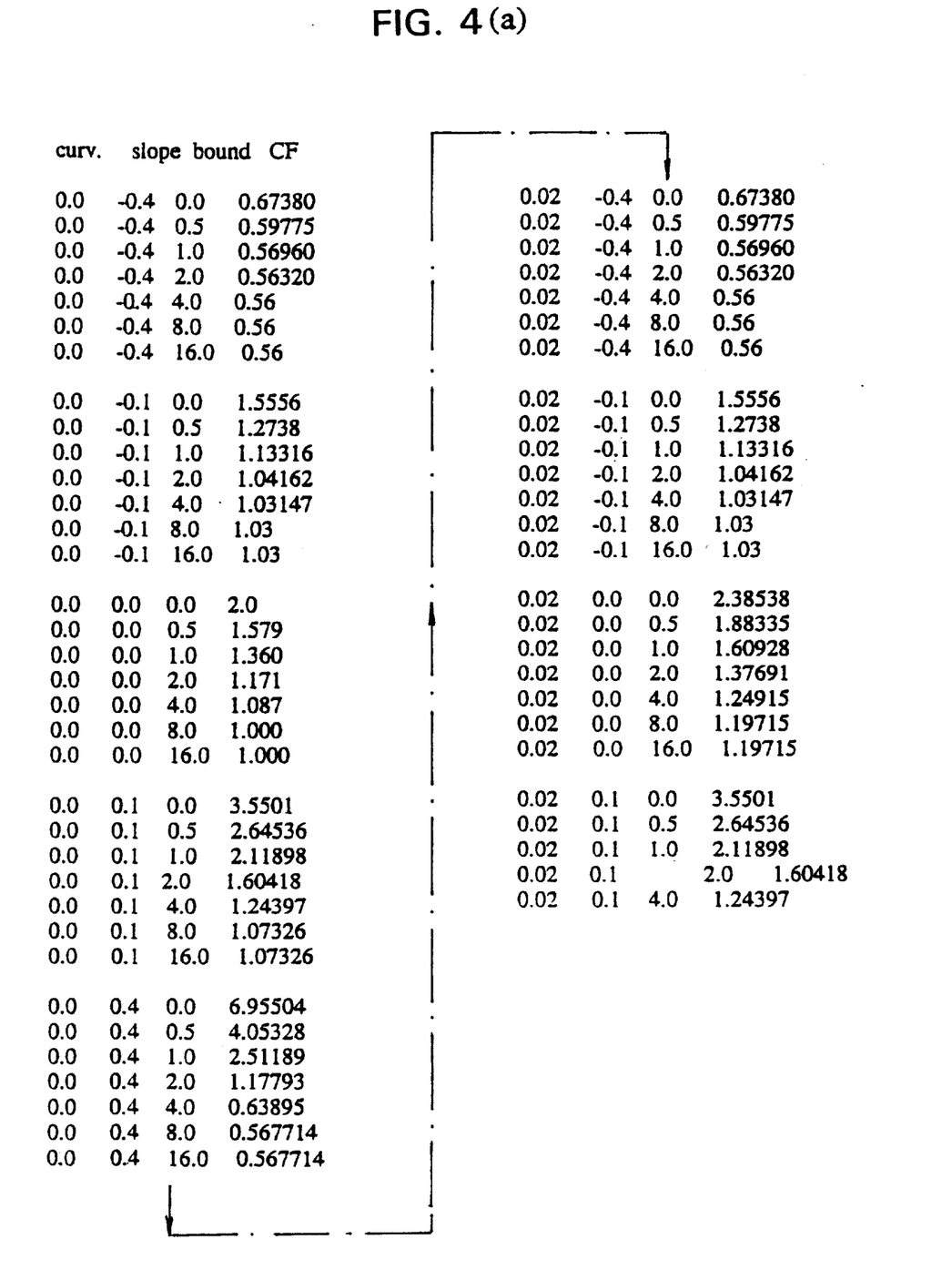

Third, a database is constructed which gives the evolution of the correction factor as a function of each of the parameters obtained in step f2. This evolution can be determined by a set of 3D finite element simulations. Design of experiments (DOE) was used to determine which parameters of the input resistivity profile must be varied (and also how) in order to minimize the number of simulations required to obtain a detailed database. The database for one-dimensional profiles is described in detail to illustrate the principle. FIG. 3 gives a graphical presentation of an extract of this database: it shows the evolution of the correction factor (defined by equation 2) as a function of the local slope and local curvature of the profile and the distance between the centre of the probe and an insulating boundary. The probe radius is taken into account by taking relative values for the three parameters: the relative slope is defined as the product of the slope with the probe radius, the relative curvature as the product of the curvature with the squared probe radius, and the relative distance as the distance divided by the probe radius. Thus, a relative slope s corresponds to a resistivity change of s decades over a distance equal to one probe radius. Part of the nano-SRP database for one-dimensional carrier profiles is shown in FIGS. 4(a) and 4(b), displaying the correction factor as a function of the probe radius, relative slope, relative curvature and distance to an isolating boundary.

In a fourth step, for a given resistivity profile (given by a numerical data set) the values of all parameters from step f3 are calculated for every point of the resistivity profile and interpolation (e.g. linear or cubic interpolation) of the database is used to find the correction factor profile which pertains to the carrier profile. Note that the parameters which are defined by the Taylor terms can easily be calculated by a central difference method. Note that every point of the resistivity profile is to be interpeted according to the following methodology. The resistivity profile is split up in intervals of a predetermined length, which can be different for each interval and which can include overlapping intervals. For each interval one point is taken. This methodology applies for the whole specification.

Finally, the correction factor profile is transformed into the resistance profile which is searched, using the correction factor definition from the step f1.

Figure 5A:
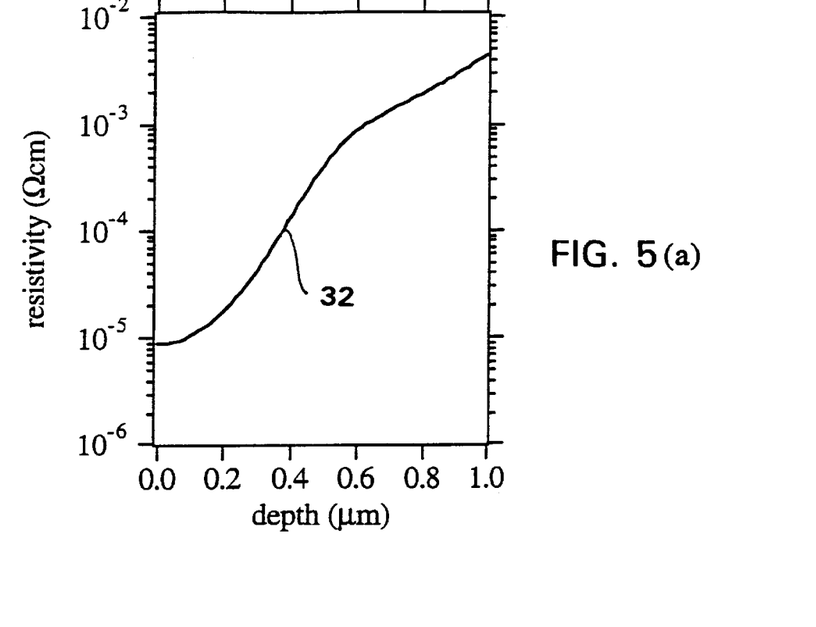
FIG. 5(a) shows a one-dimensional nano-SRP and resistivity profile (32)
Figure 5B:
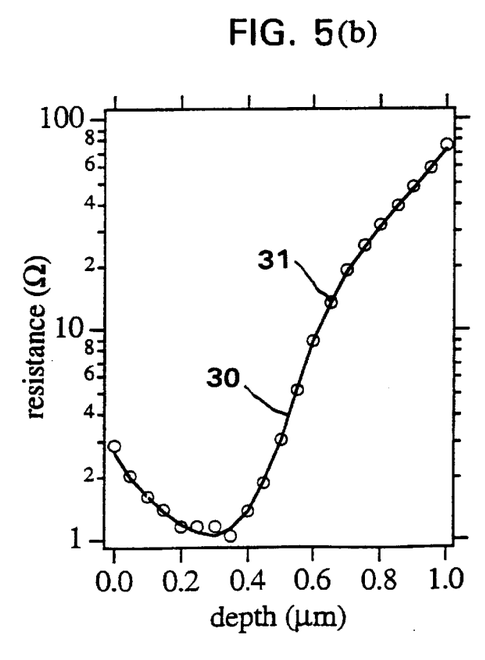
FIG. 5(b) shows the simulated (full line, 30) and expected (circles, 31) resistance profile for one one-dimensional nano-SRP resistivity profile (32) shown in FIG. 5(a). The corresponding correction factor profile (33) is given in FIG. 5(c). The probe radius was 100 nm.
Figure 5C:
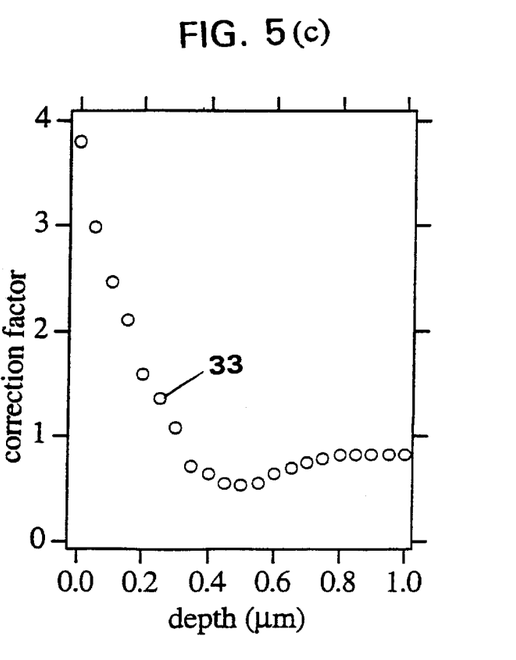

Clearly, steps f1, f2 and f3 are performed only once for each carrier profiling technique. Steps 4 and 5 can be repetitively used for different resistivity profiles, without repeating steps f1,f2 and f3. For the one-dimensional example, the correction factor profile is found by calculating the distance, slope and curvature for each data point (e.g. by a central difference method) and interpolating the database presented in FIGS. 3(a) and 3(b), 4(a) and 4(b). FIGS. 5(a), 5(b) and 5(c) show the resistance profiles obtained by simulation and by using the 'forward' algorithm described, for a one-dimensional resistivity profile example (100 nm probe radius, 50 nm stepsize). FIG. 5a shows the input resistivity profile. FIG. 5b shows both resistance profiles. The accuracy of the predicted resistivity profile is better than 10%, except for those points which are close to the boundary where it goes up to 25%. The reason for this discrepancy can be found in the numerical method used for the calculation of the slopes and curvatures which loses accuracy near boundaries. FIG. 5c shows the corresponding correction factors for each data point.

Inverse problem

The aim of the invention is to be able to derive a carrier concentration profile in a non-homogeneously doped semiconductor from a cross-sectional profiling measurement technique and to correct substantially automatically for the current spreading effects. Therefore one has to solve the inverse problem: the transformation of the measured (raw) resistance data into a dopant (or carrier) profile. This conversion is shown schematically in FIG. 6 and can be divided in three major parts:

(i1) Smoothing of the resistance data.
(i2) Conversion of the smoothed resistance data into resistivity values using the database obtained in the forward problem.
(i3) Conversion of the resistivity profile in the carrier or dopant profile.

An adequate smoothing procedure is applied to the raw resistance values before they are processed by the actual correction algorithm. This smoothing algorithm is essential since a minor change of the input resistance values can be the indication of a large resistivity change. It is thus essential that the smoothing step eliminates measurement noise, but does remove as little information as possible from the underlying physical profile. Hence, an efficient constrained cubic spline smoothsing method, modified to improve its performance for input data such as SRP data [11] is used.

In the second step, the smoothed resistance data are transformed into resistivity values. This is done by solving the basic nano-SRP equation (eq2) towards r. for each point of one-or two-dimensional profile the profile. This corresponds to solving a set of N (N×N) coupled non-linear equations, since the correction factor, which is enclosed in equation (eq2), is a function of the complete resistivity profile (as found in the 'forward' method). One possible way to solve the coupled set of equations is as follows (shown here for one-dimensional profiles, but in the same way applicable to two-dimensional profiles):

(i2.1) Calculate a starting value for the resistivity profile ρ: $\rho_i$ (i=1) by using the calibration curve (i.e. $\rho_0 = 4 \cdot \alpha \cdot R$) assuming there are no corrections (α=1).
(i2.2) Calculate the corresponding correction factor profile $\alpha(\rho_i)$ by interpolation of the database.
(i2.3) Calculate a new resistivity profile $$\rho_{i+1} = \frac{4 \cdot a \cdot R}{\alpha(i + \rho_i)}.$$

(i2.4) Perform a constrained cubic spline smoothing on the new resistivity profile $r_{i+1}$
(i2.5) Repeat steps (i2.2),(i2.3) and (i2.4) until a stopping criterion is fulfilled. One possible stopping criterion is to compare the resistivity profile obtained after step (i2.2) and (i2.4) and stop the repetition when a sufficient agreement (for example expressed in terms of standard deviation at each profile position) is observed.

(note that in the above description r is used as a representation of the complete resistivity profile)

Figure 6:
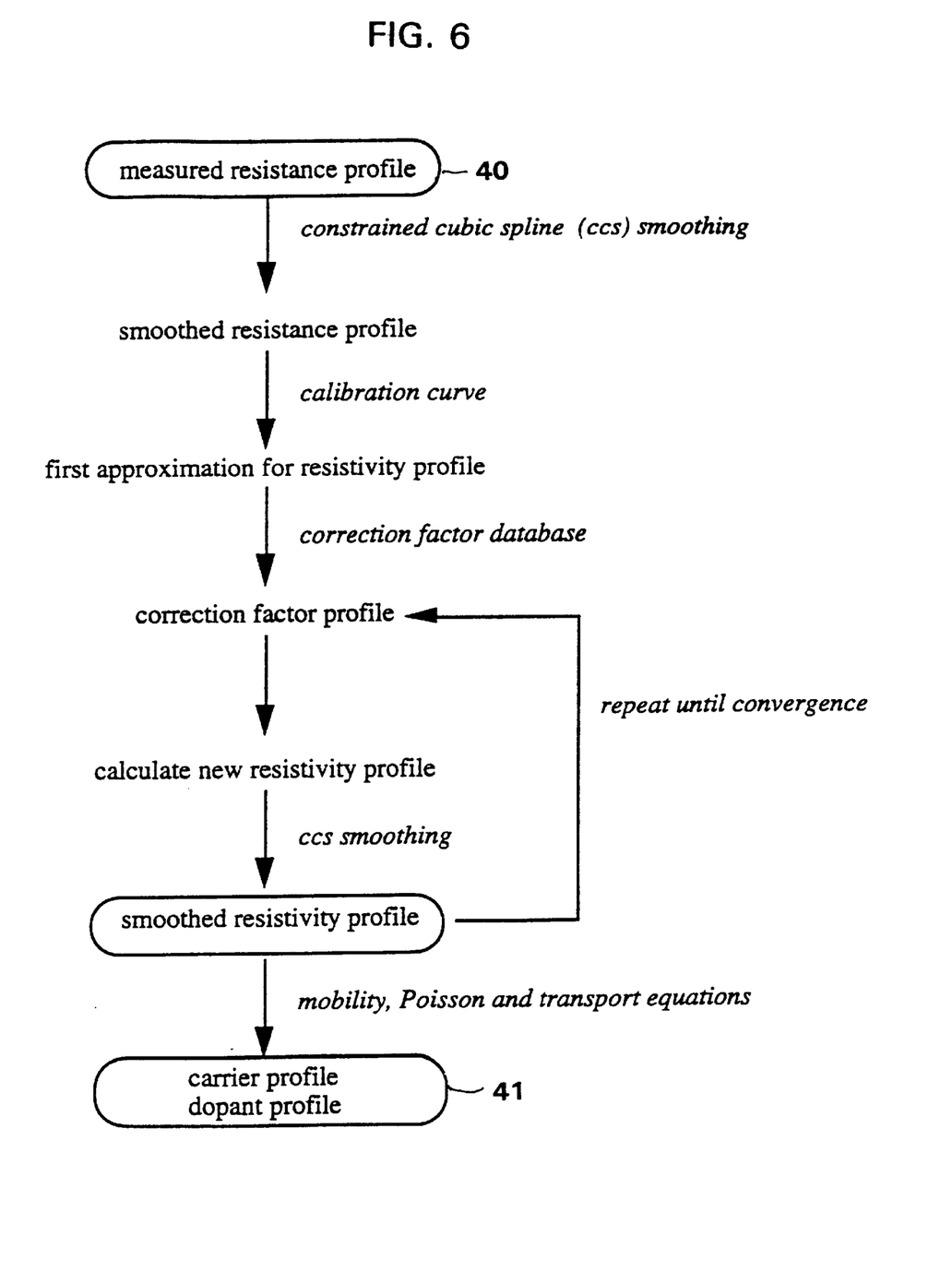
FIG. 6 shows a schematical representation of the 'inverse' method for the conversion of nano-SRP resistance data (40) into the corresponding carrier or dopant profile (41).
Figure 7A:
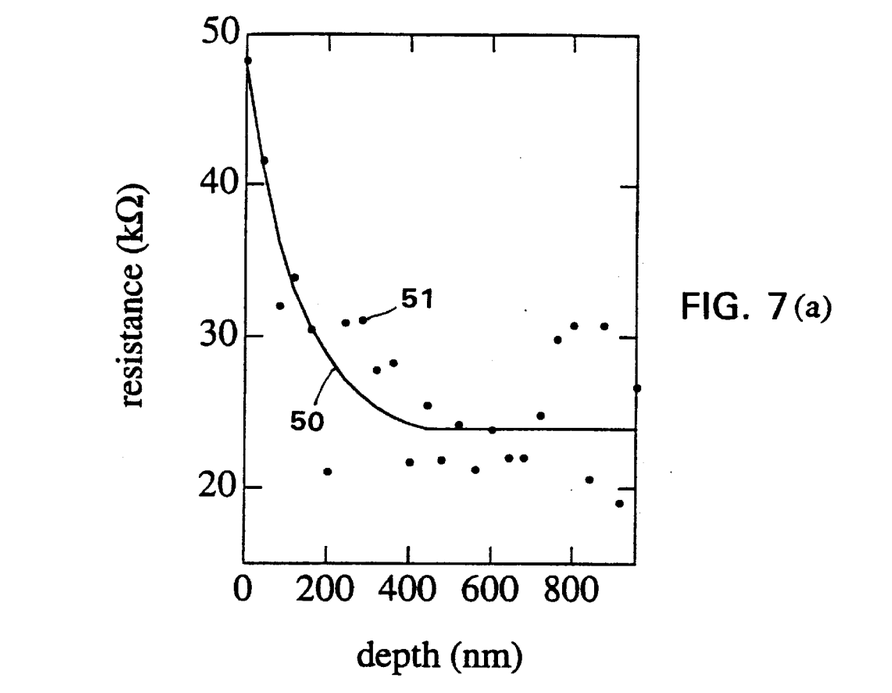
FIGS. 7(a) and 7(b) show examples of the nano-SRP 'inverse' method which transforms the measured resistance data into the corresponding carrier profile. The simulated (50) and raw (51)(with 20% noise added) resistance profile are given in FIG. 7(a). The real resistivity profile (52)(i.e. constant) as well as the resistivity profiles obtained by using the calibration curve with (53) and without (54) the correction algorithm are shown in FIG. 7(b).
Figure 7B:
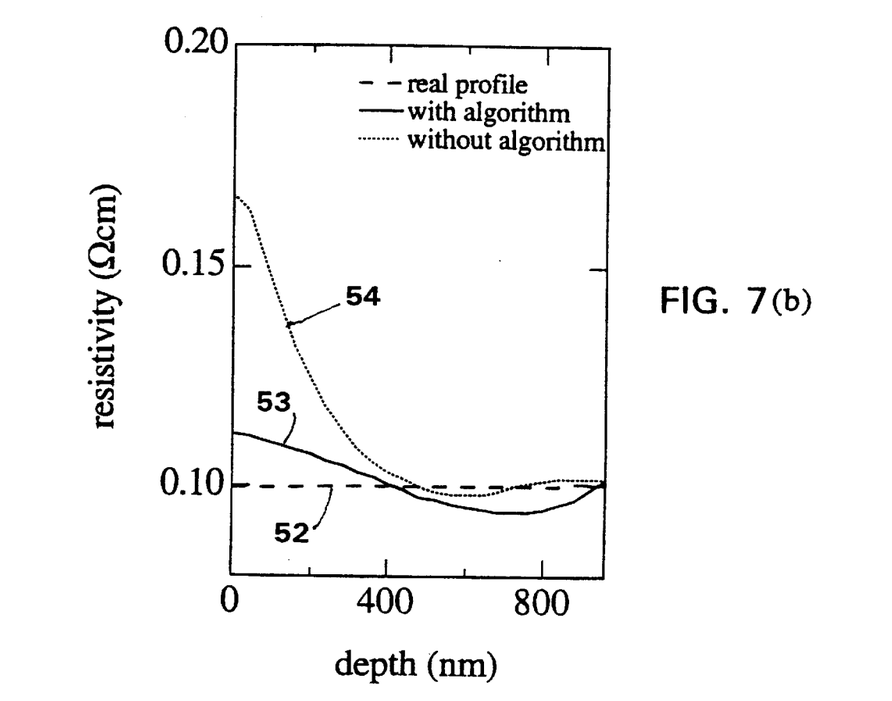

Finally, The carrier profile n and the dopant profile N can be calculated from the resistivity profile by solving the mobility equation (eq6) together with the Poisson equation (eq7).

$$\rho = \frac{1}{n_e \cdot q \cdot \mu_e(N) + n_h \cdot q \cdot \mu_h(N)} \quad (eq6)$$

$$\nabla^2 \psi = -\frac{q}{\varepsilon \cdot \varepsilon_0} \cdot (N_A - N_D + n_e - n_h) \quad (eq7)$$

Where y is the electrical potential, $N_A$ and $N_D$ are the ionized acceptor and donor concentrations, $n_e$ and $n_h$ the carrier densities for electrons and holes, $\mu_e$ and $\mu_h$ are the electron and hole mobilities which can be obtained from ASTMs resistivity/dopant conversions "Standard Practice for Conversion Between Resistivity and Dopant Density for B-doped and P-doped Si, ASTM designation F723-82, Am. Soc. Test. Mater., Philadelphia, Pa. (1988).". Also, appropriate boundary conditions must to be chosen. In order to illustrate the robustness of the algorithm we show in FIG. 7 the simulated example for a homogeneously doped semiconductor with an insulating boundary at a depth of 0 nm, whereby we deliberately added 20% random noise to the resistance values before the correction was performed. FIG. 6a shows the resistance profile obtained with a probe radius of 40 nm. The resistivity profiles obtained after smoothing and using the calibration curve with and without the algorithm are given in FIG. 6b and show an accuracy of 10 and 90% respectively compared to the real profile (i.e. constant resistivity).

SCM deconvolution

For scanning capacitance microscopy (SCM), the measured capacitance profile or the capacitance gradient profile must be transformed into the carrier concentration profile. The same general algorithm as described for nano-SRP can be used, with minor changes. Again, first the outline is given for the forward problem (carrier profile→capacitance profile) and then the inverse problem (capacitance profile→carrier profile) is described.

Forward Problem

The same five steps are used as for nano-SRP:
(1) Define a correction factor by its introduction into the basic SCM equation, which gives the capacitance or capacitance gradient as a function of the carrier concentration.
(2) Find a set of parameters describing the carrier profile adequately.
(3) Construct a database of correction factors as a function of the parameters.
(4) Calculate the parameters for a given carrier profile and use interpolation of the database to find the correction factor profile which pertains to a given carrier profile.
(5) Use the definition of the correction factor and the computed correction factor profile to calculate the capacitance profile.

The set of parameters needed in step 2 may include:
(i) the general shape of the carrier profile: slopes and curvatures of the carrier profile
(ii) the distance to insulating or conducting boundaries
(iii) the probe shape: contact radius and aspect ratio
(iv) the surface quality (for example: oxide thickness)

Inverse Problem

Only two basic steps are needed. Since the basic SCM equation does not work with the resistivity value, but immediately uses the carrier concentration the final step of the nano-SRP 'inverse' method may be omitted.
(1) Smoothing of the measured capacitance data.
(2) Conversion of the smoothed capacitance data into carrier concentration values using the database obtained in the forward problem.

Figure 8:
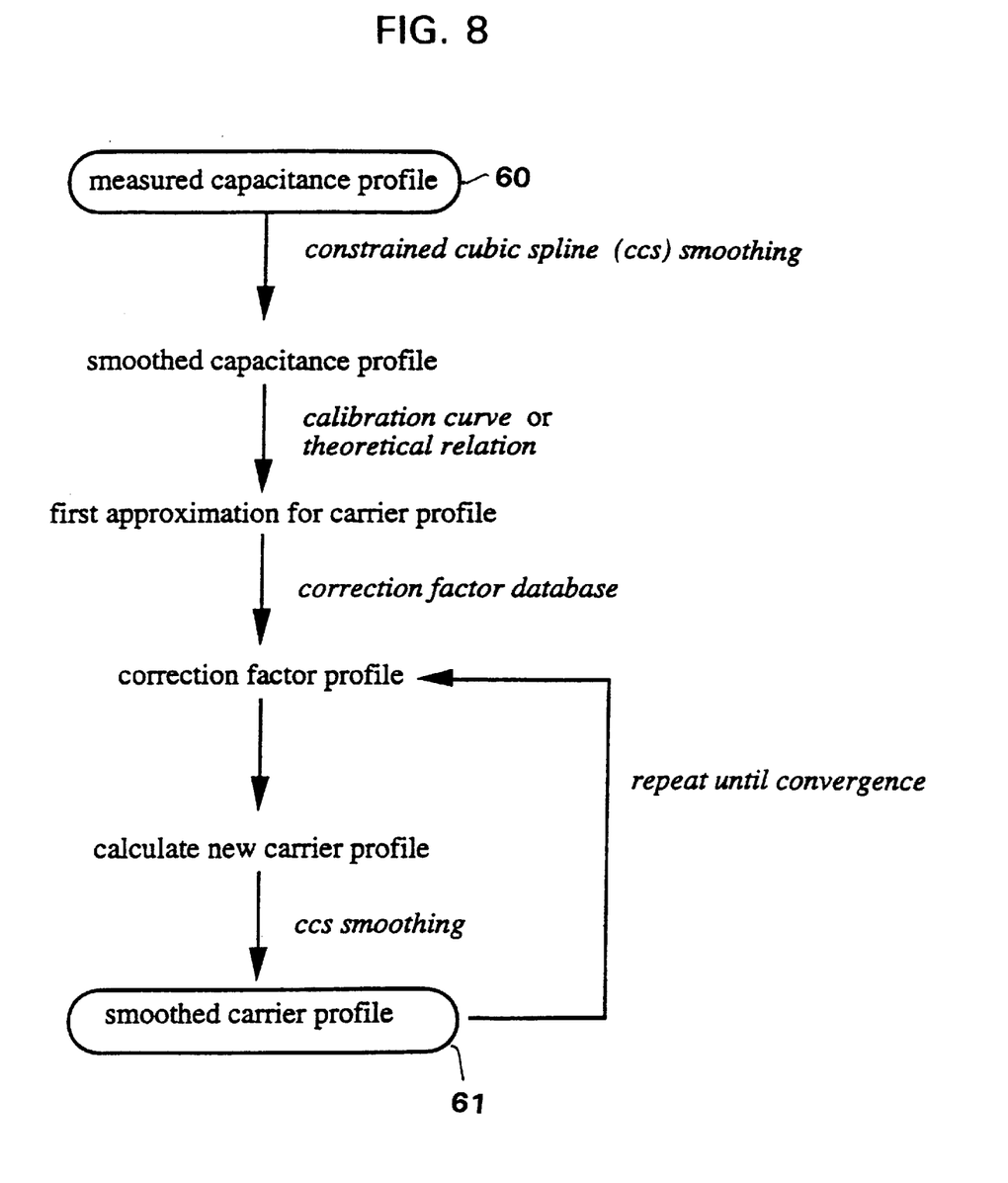
FIG. 8 shows a schematical representation of the 'inverse' method for the conversion of the measured SCM capacitance data (60) into the corresponding carrier profile (61).

FIG. 8 shows a schematic representation of the complete 'inverse' method for SCM.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A database, in a memory, the database being adapted for deriving a carrier concentration profile in a non-homogeneously doped semiconductor from a cross-sectional profiling measurement technique, comprising:
a first set of first data stored in said memory, said first data being a correction factor; and
a second set of second data stored in said memory, essentially each of said second data comprising a first and a second set of parameters, said first set of parameters characterizing said carrier concentration profile, said second set of parameters characterizing said measurement technique,
wherein essentially each data of said first set of first data is obtained from one data of said second set of data through simulation or calculation and said correction factor is adapted for correcting a theoretical or calibrated relationship between the carrier concentration in said non-homogeneously doped semiconductor and measurement data of said measurement technique on said non-homogeneously doped semiconductor, said relationship being defined for a semiconductor with a homogeneous carrier distribution.

2. Compiling a database as recited in claim 1, and using said database for deriving a carrier concentration profile in a non-homogeneously doped semiconductor from a cross-sectional profiling measurement technique, comprising the steps of:
(A) smoothing the data obtained from said measurement technique;
(B) determining a first carrier concentration profile using said relationship;
(C) calculating a first set of values for said first set of parameters for one point of essentially each predetermined interval of said carrier concentration profile;
(D) calculating a second set of values for said second set of parameters;
(E) determining the correction factor for one point of essentially each predetermined interval of said first carrier concentration profile by interpolating within said database using said first and said second set of values;
(F) determining a second carrier concentration profile using said first carrier concentration profile, said relationship and the correction factors; and
(G) repeating the foregoing steps (C) to (F) until a subsequent iteration yields substantially the same carrier concentration profile as obtained in the foregoing iteration.

3. Compiling and using a database as recited in claim 2 wherein the cross-sectional profiling measurement technique is the nano-SRP or nano-potentiometry measurement technique.

4. Compiling and using a database as recited in claim 3 wherein the cross-sectional profiling measurement technique is the scanning capacitance microscopy measurement technique.

5. A database, in a memory, the database being adapted for deriving a carrier concentration profile in a non-homogeneously doped semiconductor from a cross-sectional profiling measurement technique, comprising:
a first set of first data stored in said memory, said first data being a correction factor; and
a second set of second data stored in said memory, essentially each of said second data comprising a first and a second set of parameters, said first set of parameters characterizing said carrier concentration profile, said second set of parameters characterizing said measurement technique, wherein essentially each data of said first set of first data is obtained from one data of said second set of data through simulation or calculation and said first set of parameters characterizing said carrier concentration profile includes at least one term of a series expansion of said carrier concentration profile.

6. The database as recited in claim 5, wherein said first set of parameters characterizes one point of an interval of said carrier concentration profile and further includes the distance between said point and one boundary or surface or edge of said semiconductor.

7. The database as recited in claim 6 wherein the cross-sectional profiling measurement technique is the nano-SRP or te nano-potentiometry measurement technique.

8. The database as recited in claim 6 wherein the cross-sectional profiling measurement technique is the scanning capacitance microscopy measurement technique.

9. A database in a memory, the database being adapted for deriving a dopant concentration profile in a non-homogeneously doped semiconductor from a cross-sectional profiling measurement technique, comprising:
a first set of first data in said memory, said first data being a correction factor; and a second set of second data in said memory, essentially each of said second data comprising a first and a second set of parameters, said first set of parameters characterizing said dopant concentration profile, said second set of parameters characterizing said measurement technique, wherein essentially each data of said first set of first data being obtained from one data of said second set of data through simulation or calculation and said correction factor is adapted for correcting a theoretical or calibrated relationship between the dopant concentration in said non-homogeneously doped semiconductor and measurement data of said measurement technique on said non-homogeneously doped semiconductor, said relationship being defined for a semiconductor with a homogeneous dopant distribution.

10. Compiling a database as recited in claim 9, and using said database for deriving a dopant concentration profile in a non-homogeneously doped semiconductor from a cross-sectional profiling measurement technique, comprising the steps of:

(A) smoothing the data obtained from said measurement technique;

(B) determining a first dopant concentration profile using said relationship;

(C) calculating a first set of values for said first set of parameters for one point of essentaily each predetermined interval of said dopant concentration profile;

(D) calculating a second set of values for said second set of parameters;

(E) determining the correction factor for one point of essentaily each predetermined interval of said first dopant concentration profile by interpolating within said database using said first and said second set of values;

(F) determining a second dopant concentration profile using said first dopant concentration profile, said relationship and said correction factors; and (G) repeating the foregoing steps (C) to (F) until a subsequent iteration yields substantially the same dopant concentration profile as obtained in the foregoing iteration.

11. Compiling and using a database as recited in claim 10 wherein the cross-sectional profiling measurement technique is the nano-SRP or nano-potentiometry measurement technique.

12. Compiling and using a database as recited in claim 10 wherein the cross-sectional profiling measurement technique is the scanning capacitance microscopy measurement technique.

13. A database in a memory, the database being adapted for deriving a dopant concentration profile in a non-homogeneously doped semiconductor from a cross-sectional profiling measurement technique, comprising:

a first set of first data in said memory, said first data being a correction factor; and a second set of second data in said memory, essentially each of said second data comprising a first and a second set of parameters, said first set of parameters characterizing said dopant concentration profile, said second set of parameters characterizing said measurement technique, wherein essentially each data of said first set of first data being obtained from one data of said second set of data through simulation or calculation and said first set of parameters characterizing said dopant concentration profile includes at least one term of a series expansion of said dopant concentration profile.

14. The database as recited in claim 13, wherein said first set of parameters characterizes one point of an interval of said dopant concentration profile and further includes the distance between said point and one boundary or surface or edge of said semiconductor.

15. The database as recited in claim 14 wherein the cross-sectional profiling measurement technique is the nano-SRP or nano-potentiometry measurement technique.

16. The database as recited in claim 15 wherein the cross-sectional profiling measurement technique is the scanning capacitance microscopy measurement technique.

* * * * *